United States Patent [19]

Suwa

[11] 4,390,279
[45] Jun. 28, 1983

[54] ALIGNMENT DEVICE IN AN IC PROJECTION EXPOSURE APPARATUS

[75] Inventor: Kyoichi Suwa, Kawasaki, Japan

[73] Assignee: Nippon Kogaku K. K., Tokyo, Japan

[21] Appl. No.: 166,794

[22] Filed: Jul. 8, 1980

[30] Foreign Application Priority Data

Jul. 12, 1979 [JP] Japan ................................. 54-87460
Jul. 12, 1979 [JP] Japan ................................. 54-87461
Jul. 12, 1979 [JP] Japan ................................. 54-87462

[51] Int. Cl.³ ............................................. G01B 11/00
[52] U.S. Cl. ...................................... 356/401; 356/363
[58] Field of Search ............... 356/363, 399, 400, 401; 250/548

[56] References Cited

U.S. PATENT DOCUMENTS 4,127,777 11/1978 Binder .............................. 356/400
4,252,442 2/1981 Dandliker et al. .................. 358/363

FOREIGN PATENT DOCUMENTS 53-32759 3/1978 Japan ................................. 356/363

OTHER PUBLICATIONS

Jenkins et al. *Fundamentals of Optics*, 3rd Edition, McGraw-Hill Book Company, New York, ©1957 pp. 329-333.

*Primary Examiner*—R. A. Rosenberger
*Attorney, Agent, or Firm*—Shapiro and Shapiro

[57] ABSTRACT

An alignment device in an IC projection exposure apparatus includes a projection lens system for viewing to a wafer surface having a reference mark comprising a periodic pattern structure having a predetermined period in one direction and a mask surface having a reference mark to be position-adjusted with respect to the reference mark of the wafer, the projection lens system being capable of forming an image of an observation light source on the wafer surface through the mask surface, and an observation optical system for detecting the reflected light from the wafer surface passed through the projection lens system. The device further includes means for selecting a particular component of the diffracted light from the wafer surface formed by the pattern of the reference mark on the wafer, and for directing the particular component to the observation optical system. Said means includes a light-intercepting member provided near the pupil of the observation optical system and formed with a light-transmitting opening extending in a band-like form in a direction orthogonal to the direction of the period of the reference mark on the wafer surface.

6 Claims, 27 Drawing Figures

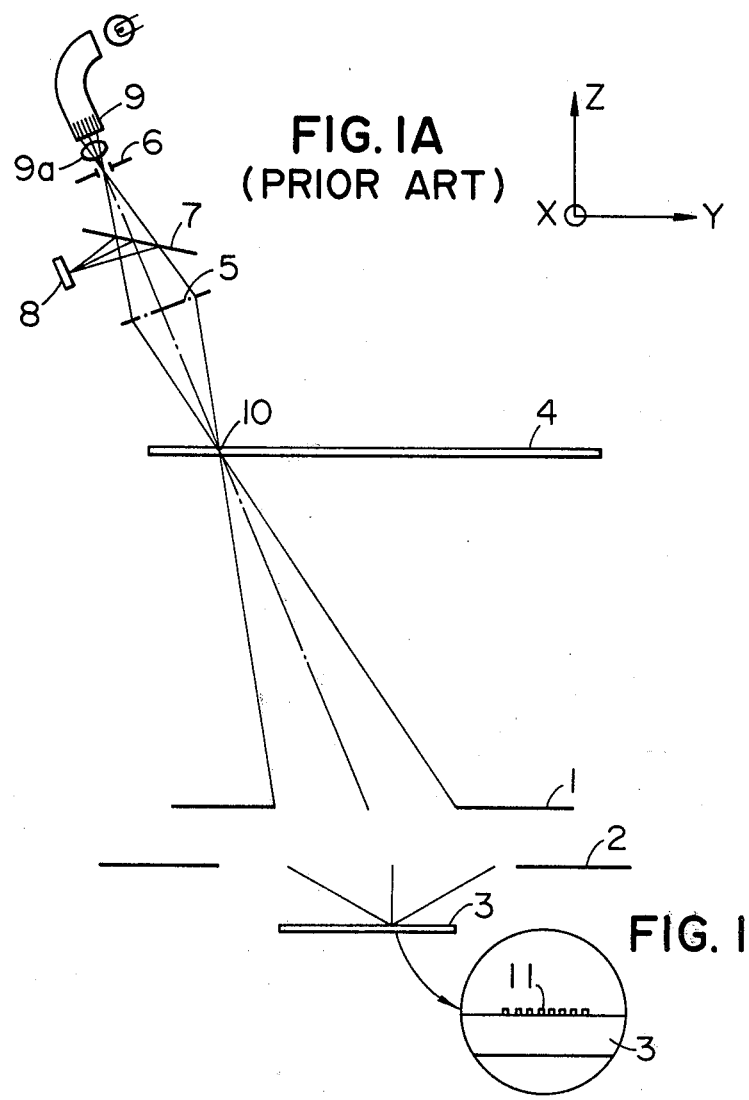

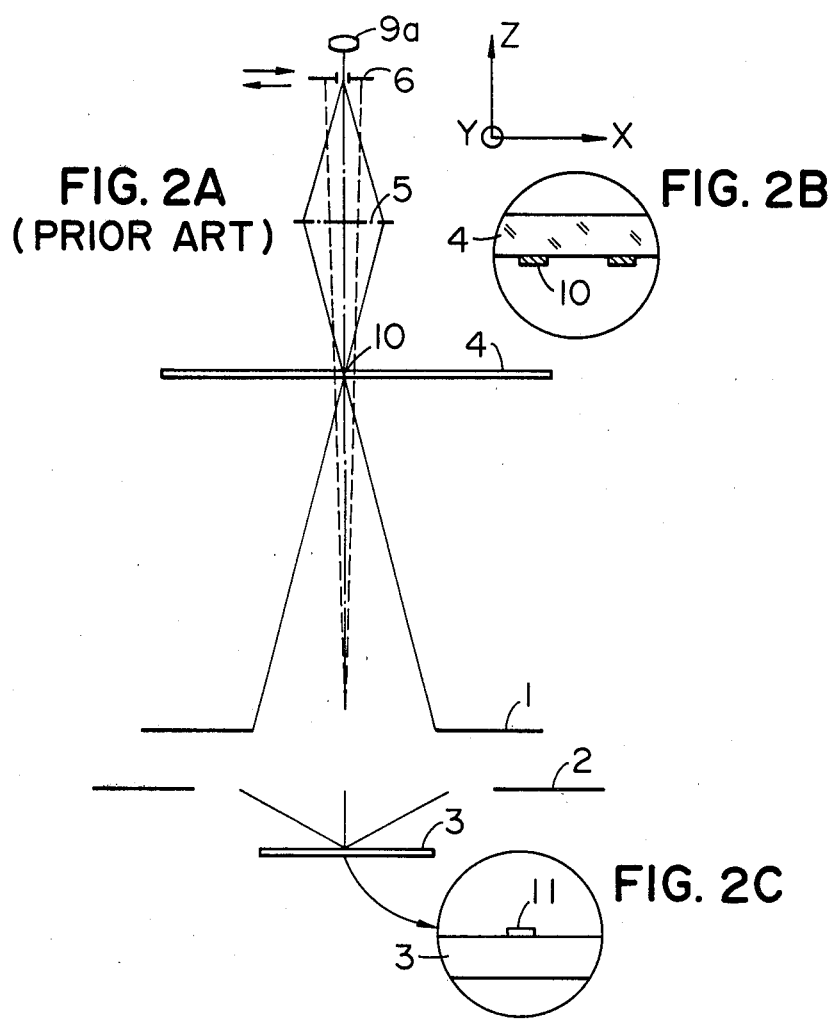
FIG. 2A (PRIOR ART)
FIG. 2B
FIG. 2C
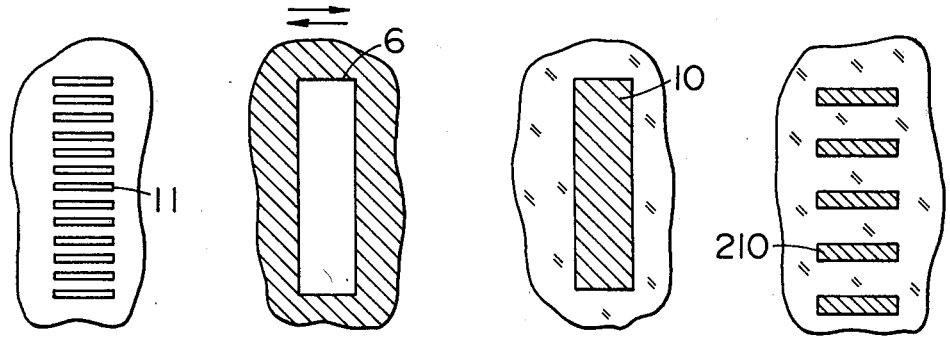
FIG. 3A   FIG. 3B   FIG. 3C   FIG. 3D

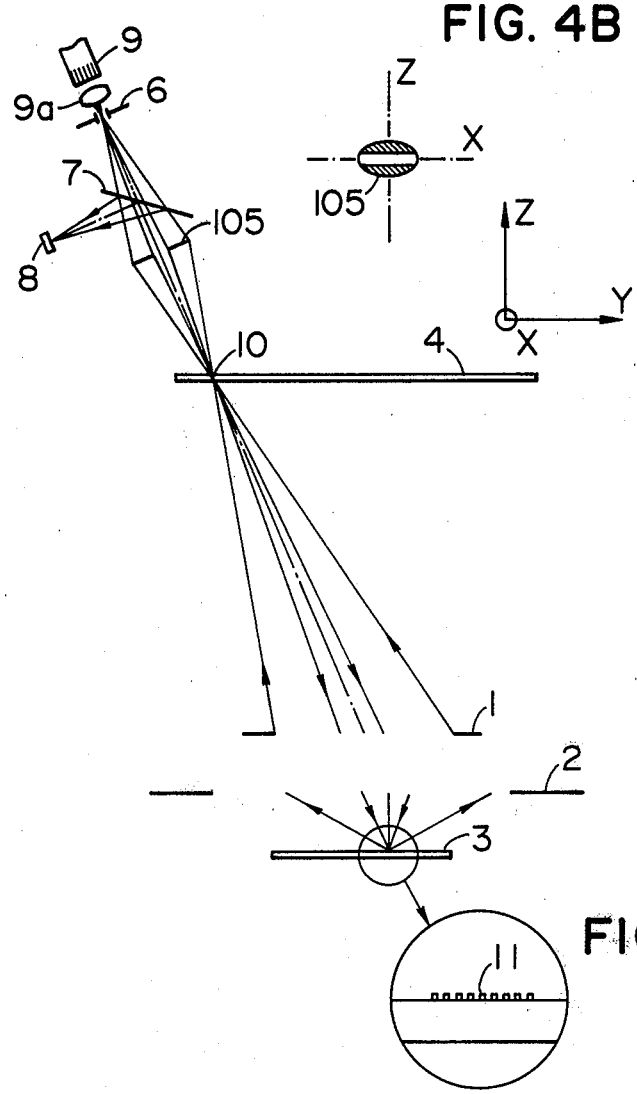

ALIGNMENT DEVICE IN AN IC PROJECTION EXPOSURE APPARATUS

BACKGROUND OF THE INVENTION

1. Field of the Invention

This invention relates to an alignment device for a mask and a wafer in an IC (integrated circuit) projection exposure apparatus. The projection exposure is the imaging type of exposure by a so-called optical lens using visible and ultraviolet light rays.

2. Description of the Prior Art

Generally, in the projection exposure method by the optical lens of a printing apparatus for manufacturing LSI or VLSI integrated circuits, the pattern of a mask is projected upon a wafer through an imaging projection lens. Particularly, in an apparatus wherein the mask pattern is projected and exposed upon the wafer while being reduced in scale to about 1/10, the same pattern is repetitively exposed on a single wafer. It is therefore desirable to detect, observe and confirm the relative positions of the mask and wafer through a projection lens each time the IC chip is printed. Such a system is called the step alignment or the each alignment (hereinafter referred to as the step alignment).

To carry out the above-described step alignment, for example, an observation optical system, as will be later described and as shown in FIG. 1 of the accompanying drawings, has been provided on the upper portion of the projection lens and the relative relation between the alignment mark on the mask and the alignment mark on the wafer has been confirmed through the observation optical system. A device of this type is generally called the alignment optical system or device.

However, problems in alignment arise, chiefly due to the poor contrast of the wafer pattern. That is, usually, the pattern on the wafer is of low contrast and particularly, in its exposed condition, the photoresist applied to the whole surface of the wafer causes lower contrast to occur.

For example, when an alignment mark pattern of $SiO_2$ on a Si wafer is considered, the total reflection factors of Si and $SiO_2$ are almost equal to each other, and it is therefore difficult to visually distinguish the mark because of low contrast. Accordingly, at present, in the case of a $SiO_2$ alignment mark, patterns having minute periods are combined together and use is made of the phenomenon that the scattered light and diffracted light around each periodic pattern structure of the mark spread outside of the projection system; and when this is viewed as an image, the peripheral portion of the edge becomes a dark portion. However, even this still suffers from the disadvantage that the contrast is poor. Also, as a method of making an alignment mark, there is a method which increases the wafer printing step by one cycle and utilizes the anisotropic etching of the wafer to provide the wafer surface with a dug-in mark to thereby achieve increased contrast. However, this method suffers from the disadvantage that the steps of process are complex.

In view of this, there has recently been proposed a method which uses laser light as a light source, projects a spot upon $SiO_2$ alignment marks through a projection lens and detects the scattered light from the mark. However, this method also suffers from the following disadvantages.

Firstly, the projection lens in which aberrations occur for laser light usually optimizes the aberrations for only one to two wavelengths of white illumination light. Secondly, a laser light source must be used in addition to an illumination light source and, therefore, during alignment the illumination light is wasteful. Also, the special need for the laser leads to the expensiveness of the device.

SUMMARY OF THE INVENTION

It is therefore an object of the present invention to overcome the above-noted disadvantages and to provide an alignment device which requires only an exposure light source as the illumination light source and which can detect an alignment signal having a high contrast if the alignment mark is a pattern having a periodic structure and which can easily be established not only in the case where the objective lens is telecentric at both sides but also in the case where the objective lens is telecentric at the image side.

The above object is achieved by providing, near the pupil containing the pupil position of an observation optical system, a light-intercepting member formed with a light-transmitting opening extending in a band-like form in a direction orthogonal to the direction of the period of the alignment reference mark of a wafer.

The present invention creates the following effects:

Firstly, even the imaging light from a pattern of weak contrast such as a $SiO_2$ pattern on a Si wafer can have its contrast emphasized in the dark view field and can be sufficiently improved as a signal, thereby achieving the alignment that has heretofore been regarded as difficult.

Secondly, according to the band-like illumination, in the illumination system of a light source such as Hg lamp having a widening light beam, the light is intercepted only in one direction. Therefore, a great quantity of light can be secured and, thus, there can be expected an effect equivalent to an optical system device which uses a laser to transmit only the central light beam of the pupil. Of course, a laser light source or the like may be used.

Thirdly, even in an optical system which is non-telecentric at the object side, the advantage of a fixed light-intercepting plate or a simple one-direction moving device and enhanced accuracy can be expected.

Fourthly, the present invention is applicable not only to an alignment device in an IC projection exposure apparatus, but also to optical systems which use a light source other than a laser to detect scattered light, as in the field of semiconductor manufacture, thus providing effective detecting systems.

Further, the structure of the reflection type light-intercepting plate is simple and enables an ultraviolet ray exposure lamp such as Hg lamp to be directly used an illumination light.

The invention will become more fully apparent from the following detailed description thereof taken in conjunction with the accompanying drawings.

BRIEF DESCRIPTION OF THE DRAWINGS

FIGS. 1A and 1B are schematic side views of an alignment device according to the prior art.

FIGS. 2A, 2B and 2C are front view of the FIGS. 1A and 1B device.

FIGS. 3A-3D are enlarged views showing a wafer alignment mark, an illumination slit and a mask alignment mark.

FIGS. 4A-4C illustrate a first embodiment of the present invention.

DESCRIPTION OF THE PREFERRED EMBODIMENTS

Figure 5A:
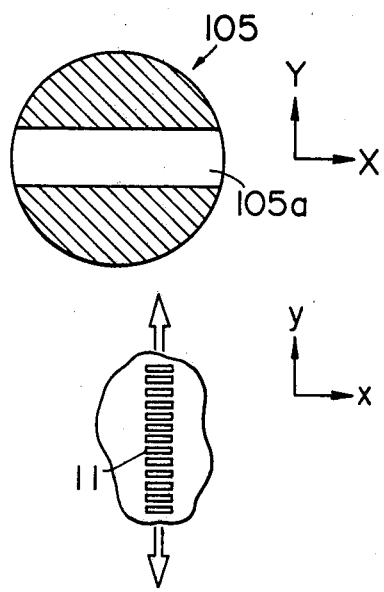
FIGS. 5A and 5B show the spatial relation between the light-intercepting plate of FIG. 4 and the wafer alignment mark.

Before describing the embodiments of the present invention, an example of the prior art alignment device shown in FIGS. 1 and 2 will first be described. In the illustrated example, the imaging system is telecentric only at the image side.

In FIGS. 1A and 2A, the light emitted from an observation plane light source 9 separate from an exposure light source is imaged at the pupil position 5 of an observation system by a condenser lens 9a and further, the light beam reaching the imaging system without being intercepted by an alignment mark 10 on a mask 4 forms a light source image at an entrance pupil 1 which lies at the diaphragm position of the imaging lens. In the drawings, the principal plane 2 of the imaging lens is shown. On the other hand, this light beam forms the image of an illumination slit 6 on a wafer 3 having an alignment mark 11 of periodic pattern structure. The slit image projected upon the wafer 3 is reflected in a manner corresponding to the place of projection so that the whole or part thereof reaches a light-receiving element 8 with the aid of means such as a half-mirror 7 or the like.

The alignment mark 11 of the wafer, as shown in FIGS. 1B and 2C and FIG. 3A (which is an enlarged plan view), is formed as a periodic pattern structure having a predetermined period in one direction, and the alignment mark 10 of the mask, as shown in FIG. 2B and FIG. 3C (which is also an enlarged plan view), is formed into a shape similar to the outline of the alignment mark 11 of the wafer, with an opaque substance such as Cr being applied thereto, and two similarly configured alignment marks 10 are provided at a predetermined interval.

The illumination slit 6, as shown in FIG. 3B, which is an enlarged plan view, is formed by cutting, in a light-intercepting plate, a slit configured similarly to the outline of the alignment mark 11.

The step alignment by the prior art alignment device of such construction is carried out in a manner which will now be described.

First, the device is set so that the image of the illumination slit 6 is formed on the wafer 3 with the same outline as the alignment mark 11. Then, the illumination slit 6 is moved in the X - Y plane (see FIGS. 1A and 2A). When the slit image is projected upon the alignment mark 10 of the mask 4, the slit image is totally reflected (regularly reflected) and does not return to the observation optical system because the mark 10 is made of Cr or like material. However, a very slight quantity of irregularly reflected light around the mask returns.

Next, when the slit image is projected upon a location in the mask 4 where the alignment mark 10 is not present, the illumination light passes through the mask 4 and the slit image is projected upon the wafer 3. In this case, when the slit image is projected upon a location on the wafer 3 where the alignment mark 11 is not present, the image is totally (regularly) reflected by the surface of the wafer 3 and, since the image side is telecentric, this reflected light returns along the same optical path as the forward path and is received by the light-receiving element 8. On the other hand, when the slit image is projected upon the wafer alignment mark 11, 0-order, ±1st order and ±2nd order diffracted light components, for example, for a N.A. (Numerical Aperture) of the objective lens=0.29 and lattice period 4 $\mu$m (when $\lambda$=436 nm, $\lambda$ being the wavelength of G-line) reach the light-receiving element 8, although this depends on the lattice period of the wafer mark 11, whereas higher order components and scattered light do not return to the objective lens. Therefore, a reduction in contrast of the wafer mark portion occurs and such reduction is received as a signal. Consequently, by moving the slit 6 in the X - Y plane, the relative position of the mask mark 10 and the wafer mark 11 is observed as a fluctuation of the output of the light-receiving element 8.

In addition, the wafer mark 11 is sandwiched between two mask marks 10 and therefore, by designating the positional difference therebetween to the wafer stage, the step alignment is completed.

Thus, when there is no difference in reflection factor between the wafer and the wafer mark, the effect of the scattered light of the periodic object and some higher orders of diffracted light components has been chiefly used in the prior art device to provide the image with a contrast. However, that contrast is weak as previously mentioned.

Therefore, to better the contrast of the image, the present invention provides a light-intercepting member having a slit or band-shaped opening for limiting the illumination light beam on or near the pupil of the observation system in a band-like form. That is, to permit passage of as much light as possible, the present invention does not limit N.A. in respect to the illumination direction in which the diffraction phenomenon of the periodic object is not conspicuous, but limits N.A. in respect to the illumination direction in which this diffraction phenomenon occurs. The position at which the light-intercepting member is located may be in the imaging lens or in the observation system, but herein, in relation to the construction of the device, the light-intercepting member is preferably disposed in the observation system is shown. Generally, the illumination light from a Hg lamp, unlike laser light, causes a reduction in quantity of light if N.A. is stopped by the illumination system and this is inconvenient, but the present invention has the merit that N.A. only in one direction may preferably be limited. Under the illumination light thus limited in a band-like form, the diffracted light, which can be said to be an imaging light ray that is reflected back by the mask alignment mark and the wafer alignment mark, can be again separated into primary and higher orders of diffracted light and 0 dimension of total reflection (regular reflection) at the position of the light-intercepting member provided on said pupil if the periods of the mask alignment mark and wafer alignment mark are suitably selected. This is of course possible with a bitelecentric optical system, but is also possible even with an optical system which is telecentric only at the image side. According to the above-described principle of the present invention, there are provided various alignment signal detecting optical systems which have good contrast.

Description will now be made of a first embodiment of the present invention which realizes good contrast by adding a light-intercepting member having a band-shaped opening to the example of the prior art device which has already been described.

In the present embodiment shown in FIG. 4A, a light-intercepting plate 105 for limiting the illumination light beam is set at the pupil position of the observation system. As is apparent from FIG. 4B, which shows the construction of the light-intercepting plate 105 as seen from the direction of the Y-axis and FIG. 5A which shows the spatial relation thereof to the wafer alignment mark 11, the light-intercepting plate 105 is provided with a slit or opening 105a extending in a band-like form in a direction orthogonal to the periodic direction of the periodic structure alignment mark 11 on the wafer 3.

The present embodiment is constructed so that the illumination light beam which creates a slit image passes through the central zone of the pupil so that all of the totally reflected light from a location on the wafer 3 when the alignment mark 11 is not present returns to the light-receiving element 8. However, as regards the projected reflection image of the slit from a location where the wafer alignment mark 11 is present, the period of the wafer alignment mark 11 and the structure of the light-intercepting plate 105 are selected so that ± higher orders of diffracted light are intercepted by the light-intercepting plate 105 and only the 0-order light component passes through the plate. For example, the primary diffracted light from the light rays perpendicularly incident on the wafer mark 11 of period 4 μm is N.A. ≃±0.1 and so, in this case, the structure of the light-intercepting plate 105 may be selected so that N.A. of the illumination light at the exit pupil of the projection lens is less than ±0.1.

Figure 6A:
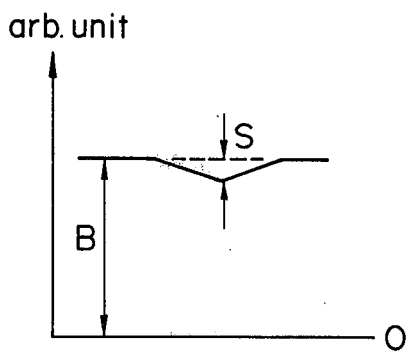
FIGS. 6A and 6B, and 10A and 10B are graphs showing the contrast ratios.
Figure 6B:
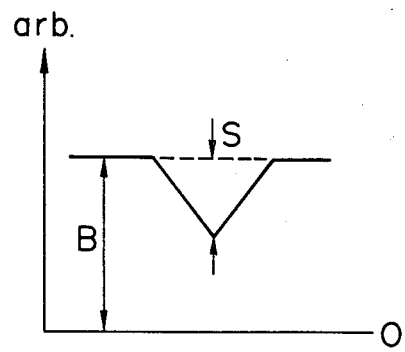

It is shown in FIGS. 6A and 6B that the contrast has been increased by the present embodiment. That is, the ratio between the alignment mark signal S and the background signal B of the wafer's total reflection surface is increased from that shown in FIG. 6A (prior art) to that shown in FIG. 6B.

Figure 5B:
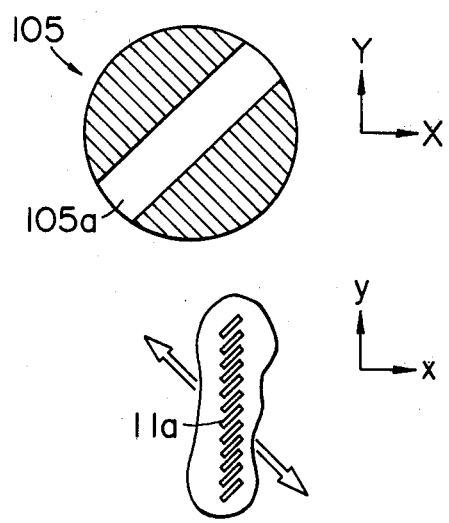

As shown in FIG. 5B, when the lattice of the wafer alignment mark 11A is inclined at a certain angle, for example, 45°, the light-intercepting plate 105 is also inclined at 45°.

Figure 7:
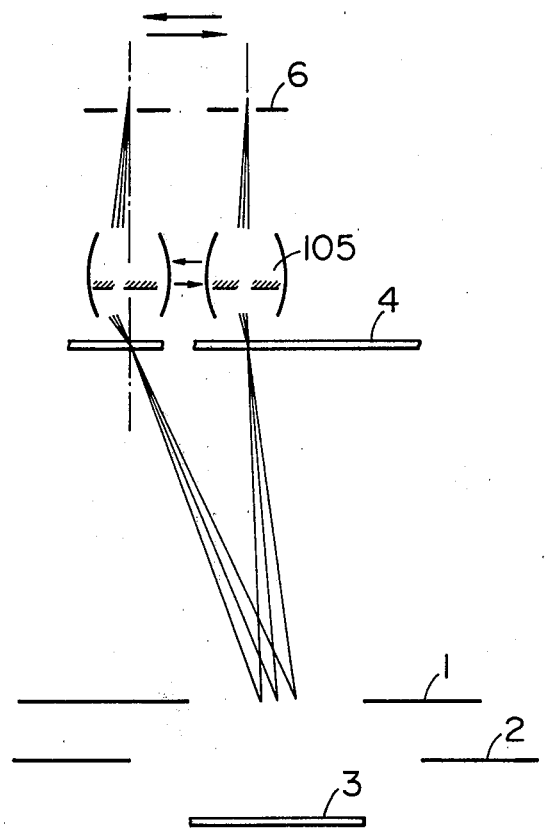
FIG. 7 illustrates the movement of the device in the case of a system which is telecentric only at the image side.

In the case of a bitelecentric system, the light-intercepting plate on the pupil is fixed, but in the case of a system which is telecentric only at the image side, as shown in FIG. 7, the observation lens of the alignment device is moved when the alignment position is varied by the size of the mask. In FIG. 7, when the optical axis of the observation system is perpendicular to the mask surface, the light-intercepting plate must move on the pupil plane, but the direction of this movement may be in one direction, which is a significant advantage. Also, in an optical system in which the observation system lens is inclined, as in the embodiment of FIG. 4, the principal ray of the imaging light can pass through the center of the pupil by movement of the mask and the light-intercepting plate may be fixed. The instrumentation for achieving this is easy.

In any case, the light-intercepting plate 105 has the advantage that it permits passage of a great quantity of illumination light beam from a Hg lamp or the like.

The above-described first embodiment is constructed so that when the slit image of the illumination light beam is projected upon a location on the wafer at which the alignment mark is not present, the totally reflected light reaches the light-receiving element, whereas when the slit image is projected upon the alignment mark of the wafer, the diffracted light component reaching the light-receiving element is limited to 0-order of component, thereby increasing the contrast. Also, a design such that all of the reflected light from outside of the wafer alignment mark is intercepted and only a particular diffracted light component of the reflected light from the alignment mark reaches the light-receiving element can also increase the contrast.

Figure 8A:
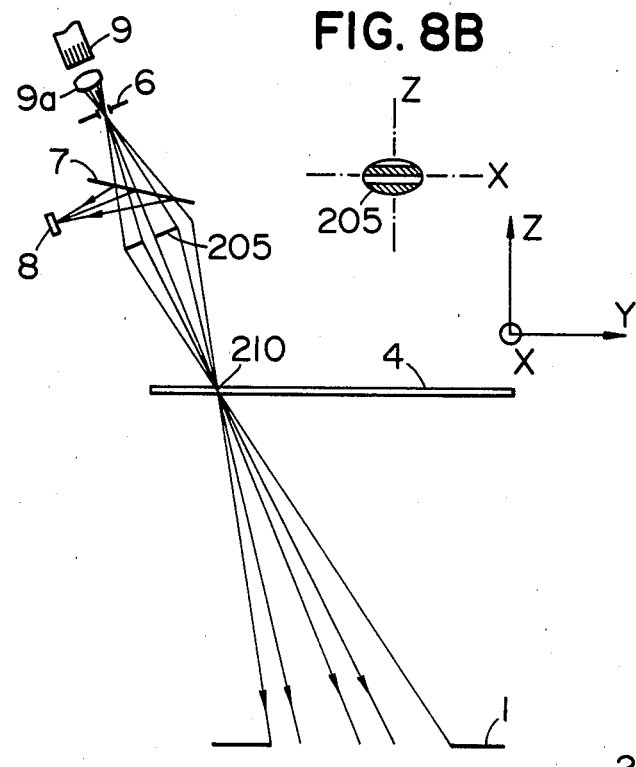
FIGS. 8A–8C illustrate a second embodiment of the present invention.
Figure 8B:
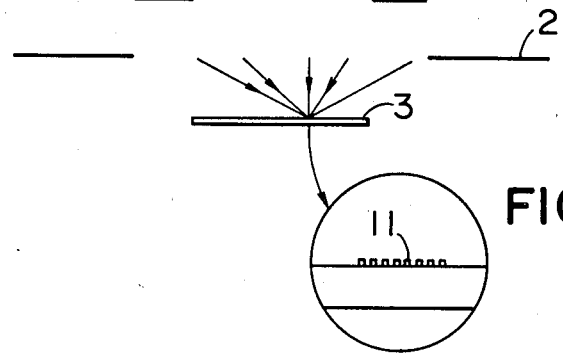
Figure 8C:
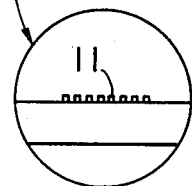
Figure 9A:
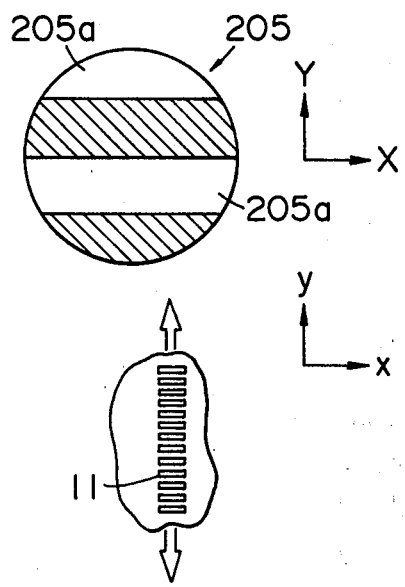
FIGS. 9A and 9B show the spatial relation between the light-intercepting plate of FIGS. 8A–8C and the wafer alignment mark.

In a second embodiment of the present invention shown in FIG. 8A, a light-intercepting plate 205 provided at the pupil position of the observation system is formed with a plurality of slits or openings 205a (FIG. 9A) at a predetermined interval which extend in a band-like form in a direction orthogonal to the periodic direction of the periodic structure alignment mark 11 of the wafer, as shown in FIGS. 8B and 9A. The alignment mark 210 of the mask, as shown in FIG. 3D, may be formed as a periodic structure having the same direction as the alignment mark 11. The relation between the two alignment marks 210 and 11 is such that with the magnification of the projection lens for printing being taken into account, the period of the mask alignment mark 210 becomes equal to the period of the wafer alignment mark 11 multiplied by the magnification of the projection lens.

Further, the second embodiment is constructed so that the illumination light beam creating a slit image periodically passes symmetrically about the center of the pupil with a duty cycle of 50%. In FIGS. 8A and 9A, the light-intercepting plate 205 is shown as being formed with two band-shaped openings 205a through which the illumination light beam may pass, but the number of such openings need not be limited if they are provided at the center of the pupil.

In the second embodiment of the above-described construction, all of the totally reflected light from a location at which the wafer alignment mark 11 is not present returns to the light-intercepting plate 205 due to the system being telecentric at the image side, but the reflected light beam returned is intercepted by the light-intercepting plate 205. Therefore, the totally reflected light is not detected by the light-receiving element 8. On the other hand, as regards the projected reflection image of the slit from the location at which the wafer alignment mark 11 is present, if the period of the wafer alignment mark 11 and the structure of the light-intercepting plate 205 are selected so that, for example, only primary and higher orders of diffracted light pass through the slits 205a of the light-intercepting plate 205 and return, then such diffracted light is measured by the light-receiving element 8. This also holds true with the mask alignment mark 210. Of course, a construction in which only scattered light is measured is also possible.

Figure 10A:
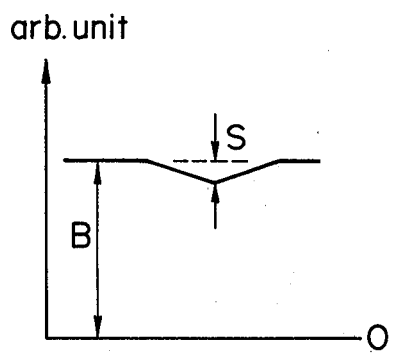
Figure 10B:
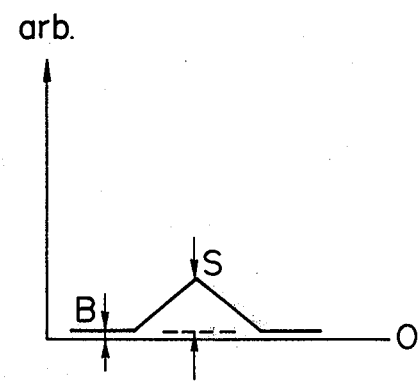

The resulting signal waveform is shown in FIG. 10B. If this waveform is compared with the waveform in the prior art shown in FIG. 10A, it will be seen that the contrast ratio of the signal in the present embodiment is much larger.

Figure 9B:
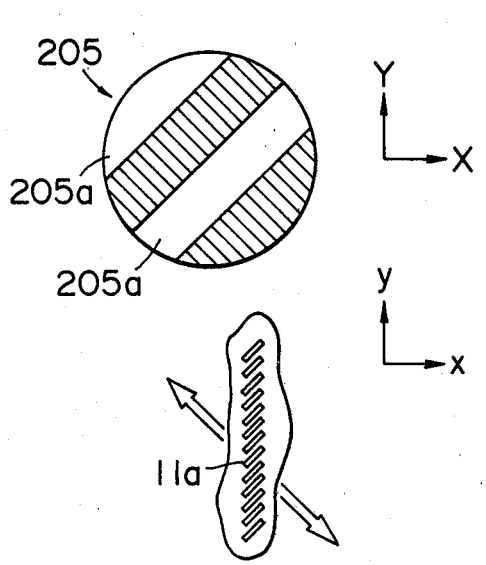

As shown in FIG. 9B, when the lattice of the wafer alignment mark 11a is inclined at a certain angle, for example, 45°, the light-intercepting plate 205 is also inclined at 45°.

As another possible construction, the light-intercepting plate may be a mirror formed with a band-shaped opening.

Figure 11A:
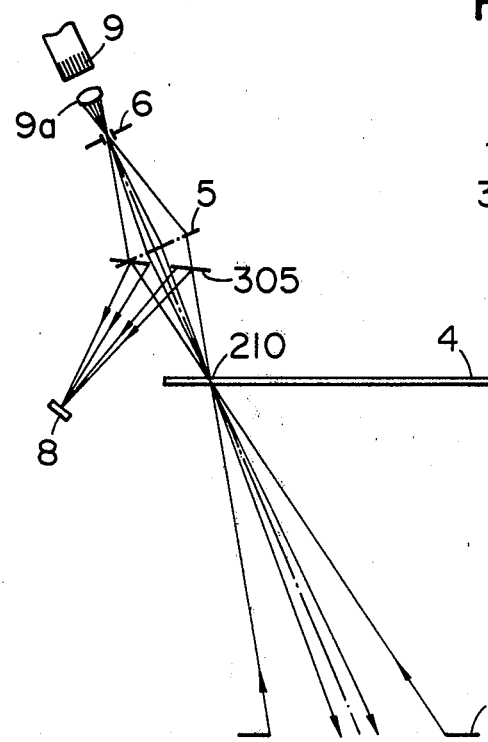
FIGS. 11A–11C illustrate a third embodiment of the present invention.
Figure 11B:
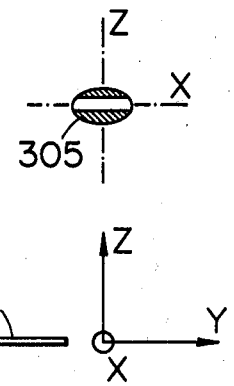
Figure 11C:
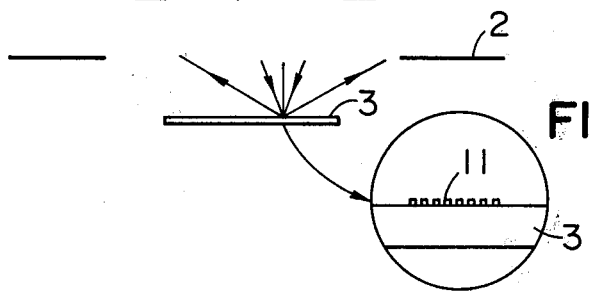

In a third embodiment shown in FIG. 11A, a reflection type light-intercepting plate 305 is installed near the pupil position 5 in inclined relationship with the optical axis. This reflection type light-intercepting plate 305 serves as a light-intercepting plate from the illumination light beam side, and the part of the plate 305 other than the band-shaped opening is a mirror surface which limits the illumination light beam and forms a reflection imaging system with respect to the light-receiving element 8. The construction of the reflection type light-intercepting plate 305 as seen from the direction of the Y-axis is shown in FIG. 11B, and the spatial relation between the light-intercepting plate 305 and the wafer alignment mark 11 is similar to that in the first embodiment shown in FIG. 5A.

The mask alignment mark 210 is formed in a shape similar to the second embodiment shown in FIG. 3D.

Further, like the first embodiment, the present embodiment is constructed so that the illumination light beam creating a slit image passes through the central zone of the pupil so that all of the totally reflected light from a location on the wafer 3 at which the alignment mark 11 is not present passes through the opening of the reflection type light-intercepting plate 305. However, as regards the projected reflection image of the slit from a location at which the wafer alignment mark 11 is present, the period of the wafer alignment mark 11 and the structure of the light-intercepting plate 305 are selected so that the ±1st order and higher orders of diffracted light impinge on the reflecting surface of the reflection type light-intercepting plate 305 and only the 0 order of light passes through the band-shaped opening.

Accordingly, when the alignment mark 11 is not present on the wafer 3, the slit image passes through the band-shaped opening (central potion) of the reflection type light-intercepting plate 305 and is not reflected.

However, when the alignment mark 11 is present on the wafer 3, scattering and diffraction occur and most of the diffracted light reaches the mirror surface of the reflection type light-intercepting plate 305, is reflected thereby, and enters the light-receiving element 8. This provides an alignment position signal. This also holds true with the mask alignment mark 210.

The comparison of the ratio between the alignment mark signal S and the background signal B of the wafer's total reflection surface in the present embodiment with the ratio in the prior art is similar to that shown in FIGS. 10A and 10B.

I claim:

1. In an alignment device including a projection lens system for forming an image of a light source on a wafer surface through a mask, the wafer surface having a first reference mark thereon comprising a periodic pattern structure having a predetermined period in a first direction and the mask having a second reference mark on a surface thereof which is to be aligned with the first reference mark, the wafer surface regularly reflecting the light from locations thereon at which the first reference mark is not present and reflecting zero primary and higher order components of diffracted light from a location at which the first reference mark is present, and including an observation optical system having means for detecting light reflected from the wafer surface and passed through the projection lens system, the improvement comprising:

means for selecting a predetermined one of the diffracted light components reflected from the wafer surface and for directing said predetermined component to the observation optical system, said means including a light-intercepting member positioned near a pupil of the observation optical system and formed with a light-transmitting opening extending in a second direction orthogonal to the first direction, the light-transmitting opening being formed to pass substantially all of the light reflected from locations on the wafer surface at which the first reference mark is not present, and being formed to pass only the zero order component of diffracted light reflected from the location on the wafer surface at which the first reference mark is present.

2. In an alignment device including a projection lens system for forming an image of a light source on a wafer surface through a mask, the wafer surface having a first reference mark thereon comprising a periodic pattern structure having a predetermined period in a first direction and the mask having a second reference mark on a surface thereof which is to be aligned with the first reference mark, the wafer surface regularly reflecting the light from locations thereon at which the first reference mark is not present and reflecting zero primary and higher order components of diffracted light from a location at which the first reference mark is present, and including an observation optical system having means for detecting light reflected from the wafer surface and passed through the projection lens system, the improvement comprising:

means for selecting predetermined components of diffracted light reflected from the wafer surface and for directing the predetermined components to the observation optical system, said means including a light-intercepting member positioned near a pupil of the observation optical system and formed with a light-transmitting opening extending in a second direction orthogonal to the first direction, the light-intercepting member being formed so as to intercept all of the light reflected from locations on the wafer surface at which the first reference mark is not present and to pass the primary and higher order components of diffracted light reflected from the location on the wafer surface at which the first reference mark is present.

3. An alignment device according to claim 2, wherein the light-intercepting member has a reflecting surface formed to reflect the intercepted light.

4. In an alignment device including a projection lens system for forming an image of a light source on a wafer surface through a mask, the wafer surface having a first reference mark thereon comprising a periodic pattern structure having a predetermined period in a first direction and the mask having a second reference mark on a surface thereof which is to be aligned with the first reference mark, the wafer surface regularly reflecting the light from locations thereon at which the first reference mark is not present and reflecting zero primary and higher order components of diffracted light from a location at which the first reference mark is present, and including an observation optical system having means for detecting light reflected from the wafer surface and passed through the projection lens system, the improvement comprising:

means for selecting predetermined components of diffracted light reflected from locations on the wafer surface at which the first reference mark is present and for directing said components to the observation optical system, said means including a light-intercepting member positioned near a pupil of the observation optical system and angled with respect to the optical axis of the projection lens system, the light-intercepting member being formed with a light-transmitting opening extending in a second direction orthogonal to the first direction and so as to pass substantially all of the light reflected for locations on the wafer surface at which the first reference mark is not present and to pass the zero order component of diffracted light while intercepting and reflecting to the detecting means the higher order components of diffracted light.

5. An alignment device according to claim 1, 2 or 3, wherein the second reference mark on the mask comprises a periodic pattern structure having a period in the first direction and being sized such that the period of the second reference mark is the same as the period of the first reference mark on the wafer surface multiplied by the magnification of said projection lens system.

6. An alignment device according to claim 1, 2 or 3, wherein said light-transmitting opening comprises a band-shaped slit, and wherein the light intercepting member is positioned so as to enable light from said light source to be projected onto the wafer surface through the slit.

* * * * *